(12) United States Patent
Luan

(10) Patent No.: US 12,176,220 B2
(45) Date of Patent: Dec. 24, 2024

(54) OPTICAL SENSOR PACKAGE AND METHOD OF MAKING AN OPTICAL SENSOR PACKAGE

(71) Applicant: STMicroelectronics Pte Ltd, Singapore (SG)

(72) Inventor: Jing-En Luan, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 500 days.

(21) Appl. No.: 17/513,122

(22) Filed: Oct. 28, 2021

(65) Prior Publication Data

US 2022/0189788 A1 Jun. 16, 2022

Related U.S. Application Data

(60) Provisional application No. 63/125,738, filed on Dec. 15, 2020.

(51) Int. Cl.
*H01L 21/48* (2006.01)
*H01L 23/00* (2006.01)
(Continued)

(52) U.S. Cl.
CPC ........ *H01L 21/4803* (2013.01); *H01L 21/486* (2013.01); *H01L 23/49827* (2013.01); *H01L 25/0655* (2013.01); *H01L 25/18* (2013.01); *H01L 25/50* (2013.01); *H01S 5/02218* (2021.01); *H01S 5/02315* (2021.01); *H01S 5/02345* (2021.01); *H01L 24/32* (2013.01); *H01L 24/48* (2013.01); *H01L 24/73* (2013.01);
(Continued)

(58) Field of Classification Search
None
See application file for complete search history.

(56) References Cited

U.S. PATENT DOCUMENTS 9,209,081 B2 12/2015 Lim et al.
9,240,536 B2 1/2016 Zitzlsperger et al.
(Continued)

FOREIGN PATENT DOCUMENTS

| CN | 102931094 A | 2/2013 |
|----|-------------|--------|
| CN | 217085267 U | 7/2022 |
| KR | 102163694 B1 | 10/2020 |

OTHER PUBLICATIONS

CN First Office Action and Search Report for counterpart CN Appl. No. 202111528098.4, report dated Sep. 30, 2024, 6 pgs.

*Primary Examiner* — Telly D Green
(74) *Attorney, Agent, or Firm* — Crowe & Dunlevy LLC

(57) ABSTRACT

A molded carrier is formed by a unitary body made of a laser direct structuring (LDS) material and includes a blind opening with a bottom surface. The unitary body includes: a floor body portion defining a back side and the bottom surface of the blind opening and an outer peripheral wall body portion defining a sidewall surface of the blind opening. LDS activation followed by electro-plating is used to produce: a die attach pad and bonding pad at the bottom surface; land grid array (LGA) pads at the back side; and vias extending through the floor body portion to make electrical connections between the die attach pad and one LGA pad and between the bonding pad and another LGA pad. An integrated circuit chip is mounted to the die attach pad and wire bonded to the bonding pad. A wafer-scale manufacturing process is used to form the molded carrier.

15 Claims, 9 Drawing Sheets

(51) Int. Cl.
  *H01L 23/498* (2006.01)
  *H01L 25/00* (2006.01)
  *H01L 25/065* (2023.01)
  *H01L 25/18* (2023.01)
  *H01S 5/02218* (2021.01)
  *H01S 5/02315* (2021.01)
  *H01S 5/02345* (2021.01)
(52) U.S. Cl.
  CPC .............. *H01L 2224/32227* (2013.01); *H01L 2224/48227* (2013.01); *H01L 2224/73265* (2013.01)

(56) References Cited

U.S. PATENT DOCUMENTS

| | | |
|---|---|---|
| 9,330,994 B2 | 5/2016 | Camacho et al. |
| 9,406,594 B2 | 8/2016 | Blakely et al. |
| 9,443,835 B2 | 9/2016 | Krabe et al. |
| 9,516,152 B2 | 12/2016 | Rudmann et al. |
| 9,614,134 B2 | 4/2017 | Gebuhr et al. |
| 9,761,565 B2 | 9/2017 | Vincent et al. |
| 10,020,434 B2 | 7/2018 | Zitzlsperger et al. |
| 10,049,967 B2 | 8/2018 | Brandl et al. |
| 10,074,769 B2 | 9/2018 | Schwarz et al. |
| 10,347,509 B1 | 7/2019 | Shen |
| 10,505,091 B2 | 12/2019 | von Malm et al. |
| 10,535,806 B2 | 1/2020 | Leirer et al. |
| 10,632,655 B2 | 4/2020 | Ficher et al. |
| 10,749,055 B2 | 8/2020 | Becker et al. |
| 2004/0018667 A1 | 1/2004 | Joshi et al. |
| 2005/0262805 A1 | 12/2005 | Nagel |
| 2006/0220209 A1 | 10/2006 | Karnezos et al. |
| 2017/0263836 A1 | 9/2017 | Ong et al. |
| 2020/0083200 A1 | 3/2020 | Yip |
| 2020/0102217 A1 | 4/2020 | Costa et al. |
| 2020/0251396 A1 | 8/2020 | Keser et al. |

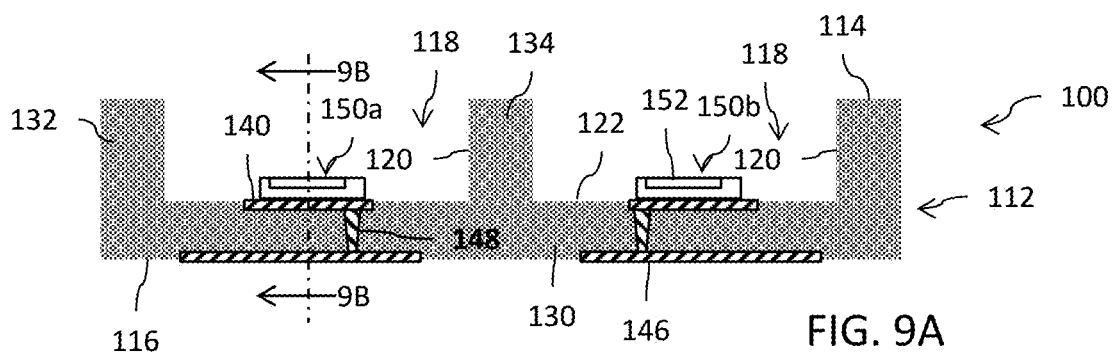
FIG. 9A
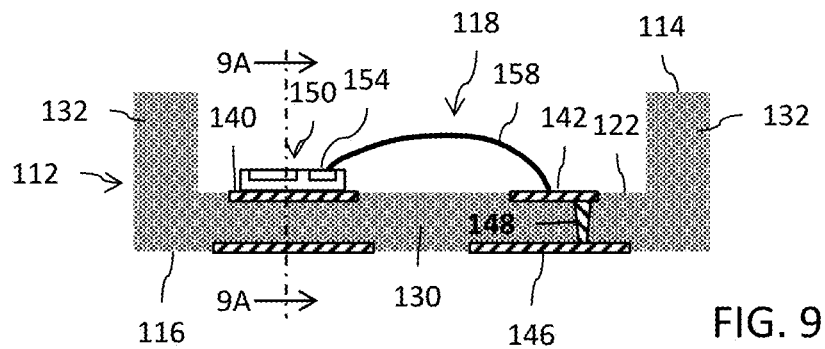
FIG. 9B
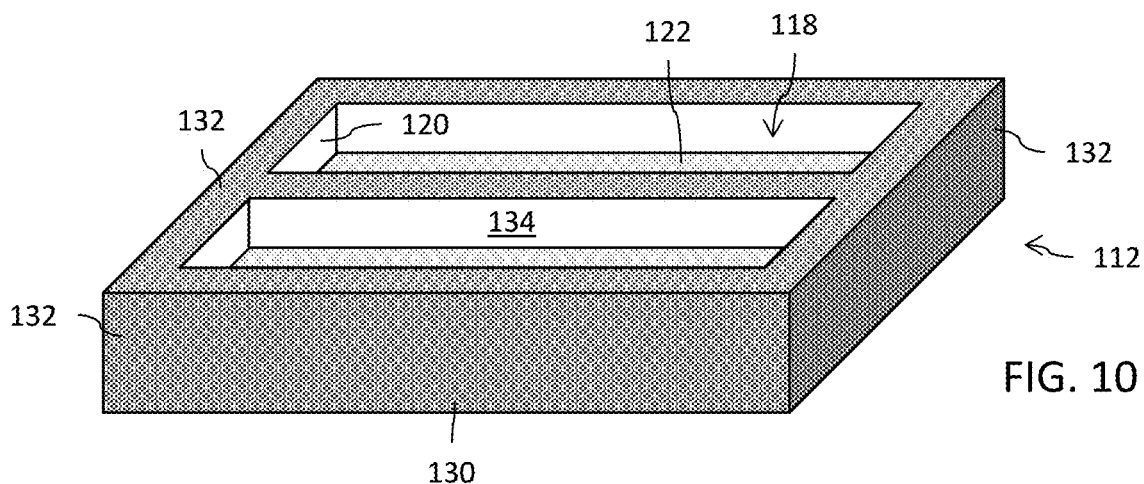
FIG. 10
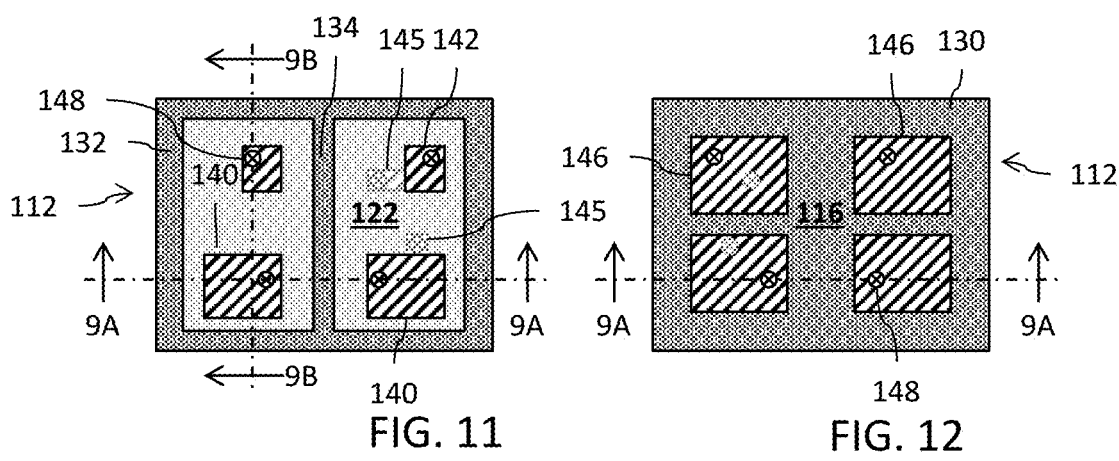
FIG. 11
FIG. 12

OPTICAL SENSOR PACKAGE AND METHOD OF MAKING AN OPTICAL SENSOR PACKAGE

CROSS-REFERENCE TO RELATED APPLICATIONS

This application claims priority from U.S. Provisional application Patent No. 63/125,738, filed Dec. 15, 2020, the disclosure of which is incorporated by reference.

TECHNICAL FIELD

The present invention generally relates to the packaging of integrated circuit chips and, in particular, to the packaging of integrated circuit chips that perform optical sensor functions such as, for example, light emission and light detection.

BACKGROUND

There are a number of common optical sensor applications that require the use of an integrated circuit chip configured as a light emitter and an integrated circuit chip configured as a light detector. An example of such an optical sensor application is a Time-of-Flight (ToF) sensor which utilizes a light emitter integrated circuit chip in the form of a vertical-cavity surface-emitting laser (VCSEL) or light emitting diode (LED) and a light detector integrated circuit chip in the form of a photodiode. These optical integrated circuit chips must be packaged, and it is critical that the packaging be easily manufacturable, robust and of low cost.

SUMMARY

In an embodiment, a package comprises: a molded carrier formed by a unitary body made of a laser direct structuring (LDS) material and including back side and a front side with a blind opening extending into the unitary body of the molded carrier from the front side, said blind opening delimited by a sidewall surface and a bottom surface, wherein the unitary body includes: a floor body portion having a lower surface defining said back side and an upper surface defining the bottom surface of the blind opening and an outer peripheral wall body portion whose outer surface defines an outer surface of the molded carrier and whose inner surface defines at least part of the sidewall surface of the blind opening.

The package further comprises: a first die attach pad at the bottom surface of the blind opening; a first bonding pad at the bottom surface of the blind opening; a plurality of land grid array (LGA) pads at the back side; and a plurality of vias extending through the floor body portion to electrically connect the die attach pad to one LGA pad and electrically connect the bonding pad to another LGA pad; wherein said first die attach pad, first bonding pad, LGA pads and vias are formed by platings at LDS activated surfaces of the molded carrier.

In an embodiment, a method comprises: molding a laser direct structuring (LDS) material to form a unitary body of a wafer-scale molded carrier that includes a back side and a front side with a plurality of blind openings extending into the unitary body from the front side, each blind opening delimited by a sidewall surface and a bottom surface, wherein the unitary body includes: a floor body portion having a lower surface defining said back side and an upper surface defining the bottom surface of the blind opening and a plurality of wall body portions having inner surfaces which define the sidewall surfaces of the blind openings.

The method further comprises: laser drilling through openings extending through the floor body portion at each blind opening; activating sidewalls of the through openings; activating portions of the bottom surface and back side; plating the activated sidewalls to form vias extending through the floor body portion; plating the activated portions to form a die attach pad at the bottom surface of each blind opening; a bonding pad at the bottom surface of each blind opening; and a land grid array (LGA) pad opposite each die attach pad and bonding pad. The vias electrically connect the each die attach pad to one LGA pad and electrically connect each bonding pad to another LGA pad.

The method further comprises cutting through certain ones of the wall body portions to singulate the wafer-scale molded carrier into a plurality of assemblies.

BRIEF DESCRIPTION OF THE DRAWINGS

For a better understanding of the embodiments, reference will now be made by way of example only to the accompanying figures in which:

FIGS. 9A and 9B show orthogonal cross-sectional views of an optical sensor package;

FIG. 10 is a perspective view of a molded carrier for the optical sensor package of FIGS. 9A-9B;

FIG. 11 shows a top view of the optical sensor package of FIGS. 9A-9B;

FIG. 12 shows a bottom view of the optical sensor package of FIGS. 9A-9B;

FIGS. 17A to 17I-2 show steps for various methods of making the optical sensor package.

DETAILED DESCRIPTION

Figure 1A:
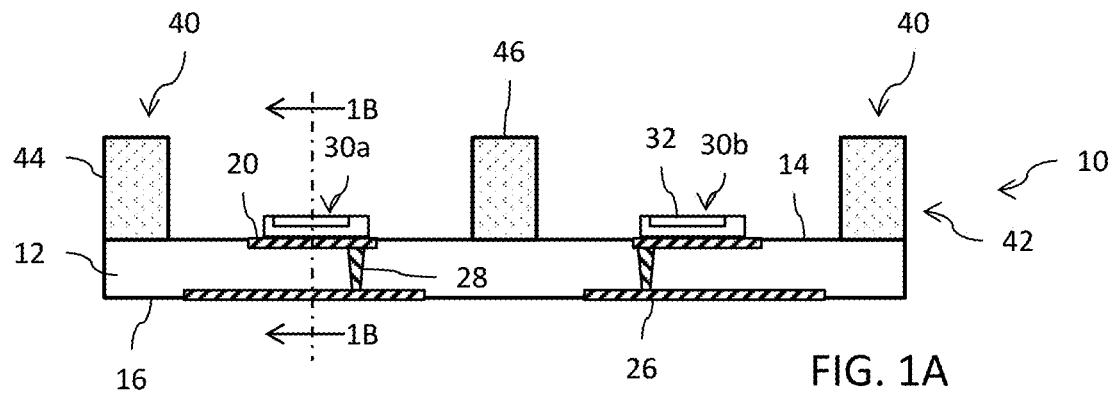
FIGS. 1A and 1B show orthogonal cross-sectional views of an optical sensor package.
Figure 1B:
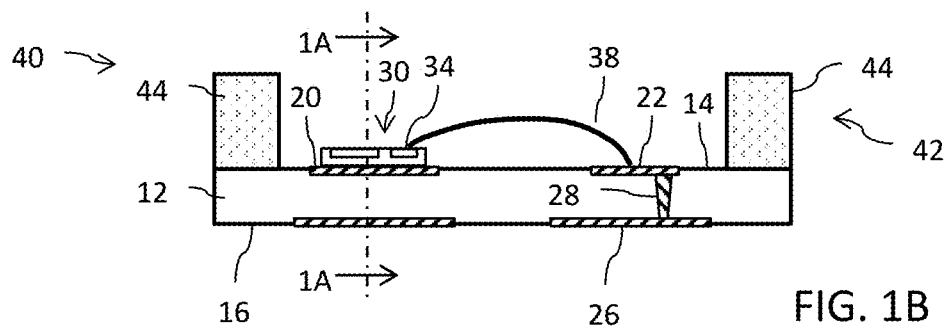

Reference is made to FIGS. 1A and 1B which show orthogonal cross-sectional views of an optical sensor package 10. A substrate layer 12 has a front side 14 and a back side 16. The substrate layer 12 may, for example, be made of an organic material normally comprising a lamination of a plurality of layers. An example of such a substrate 12 is commonly referred to as a printed circuit board (PCB). FIG.

Figure 3:
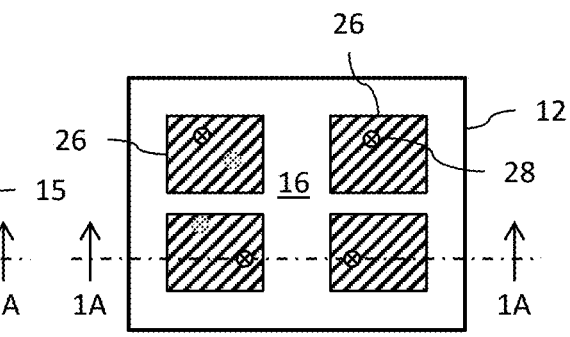
FIG. 3 shows a plan view of a back side of the substrate for the optical sensor package of FIGS. 1A-1B.

2 shows a plan view of the front side 14 of the substrate layer 12 and FIG. 3 shows a plan view of the back side 16 of the substrate layer 12. A plurality of die attach pads 20 are mounted to the front side 14 of the substrate layer 12. A plurality of bonding pads 22 are also mounted to the front side 14 of the substrate layer 12. The front side 14 of the substrate layer 12 may further include a plurality metal traces (see, reference 15), forming a redistribution layer (RDL), that are electrically connected to the die attach pads 20 and/or the bonding pads 22. A plurality of land grid array (LGA) pads 26 are mounted to the back side 16 of the substrate layer 12. A plurality of metal vias 28 extend through the substrate layer 12 to electrically interconnect each die attach pad 20 (or the metal trace of the RDL connected thereto, if used) to a corresponding one of the LGA pads 26 and electrically interconnect each bonding pad 22 (or the metal trace of the RDL connected thereto, if used) to a corresponding one of the LGA pads 26.

Integrated circuit chips 30 are mounted at the front side 14 of the substrate layer 12 to the die attach pads 20. Each integrated circuit chip 30 includes an optical integrated circuit 32 and a bonding pad 34 at a top (or front) surface. As an example, the integrated circuit chips 30 may include a chip 30a with a light emitter for the optical integrated circuit 32 in the form of a vertical-cavity surface-emitting laser (VCSEL) or light emitting diode (LED) and a chip 30b with a light detector for the optical integrated circuit 32 in the form of a photodiode. A bottom (or back) surface of the integrated circuit chip 30 is mounted to the die attach pads 20 using a conductive adhesive (not explicitly shown). A bonding wire 38 electrically connects each bonding pad 34 for the integrated circuit chip 30 to a corresponding one of the bonding pads 22 for the substrate layer 12. It will be noted in positioning the via for the bonding pad 22 that it is important for the via location to be offset from the wire bonding area for the bonding wire 38. The use of the RDL metal traces 15 can provide a way to effectively offset the via location away from the wire bonding area of pad 22.

Figure 4:
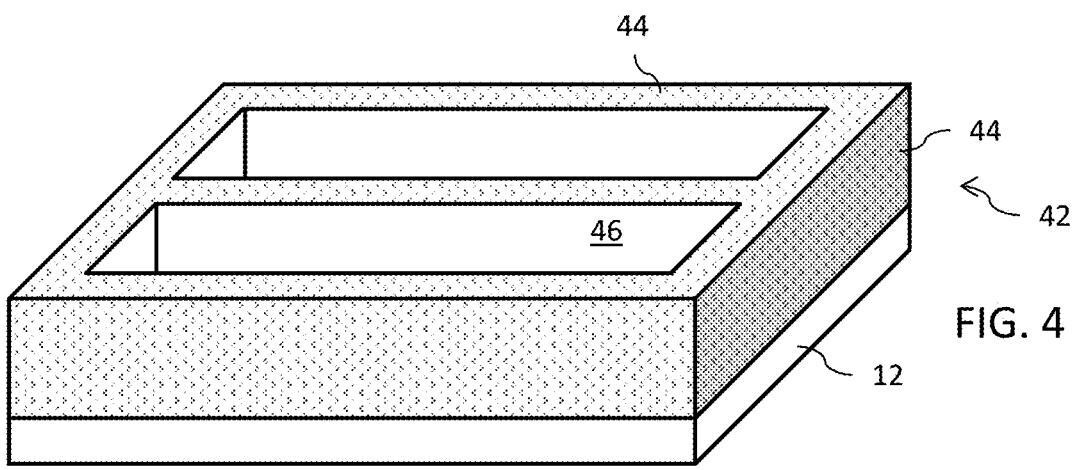
FIG. 4 is a perspective view of the optical sensor package of FIGS. 1A-1B.
Figure 5A:
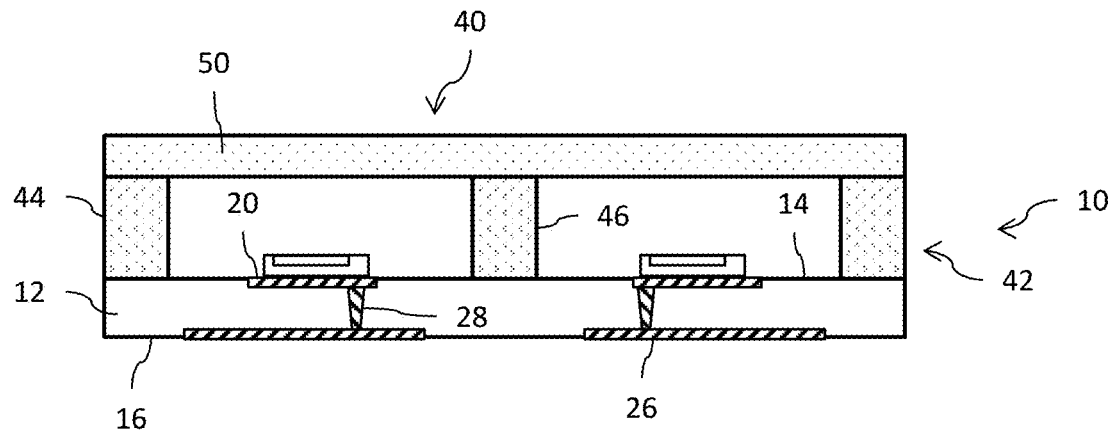
FIGS. 5A and 5B show orthogonal cross-sectional views of an optical sensor package.
Figure 5B:
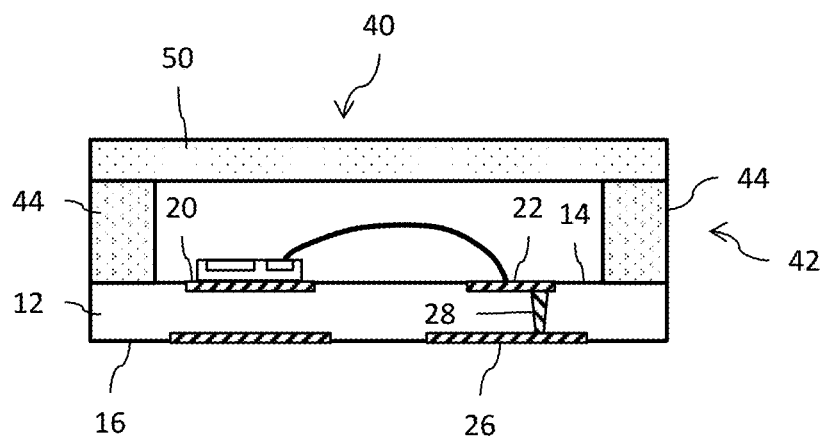
Figure 6:
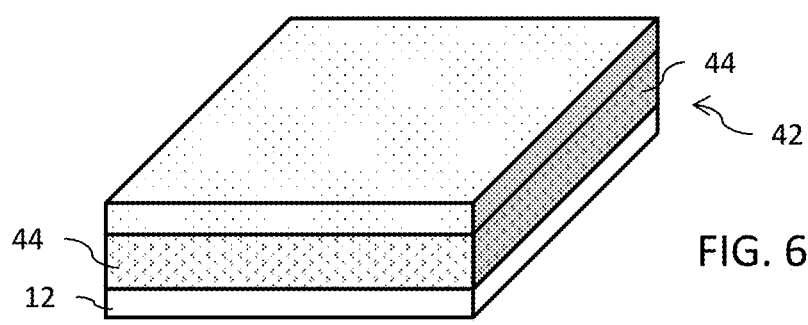
FIG. 6 is a perspective view of the cap structure for the optical sensor package of FIGS. 5A-5B.
Figure 7A:
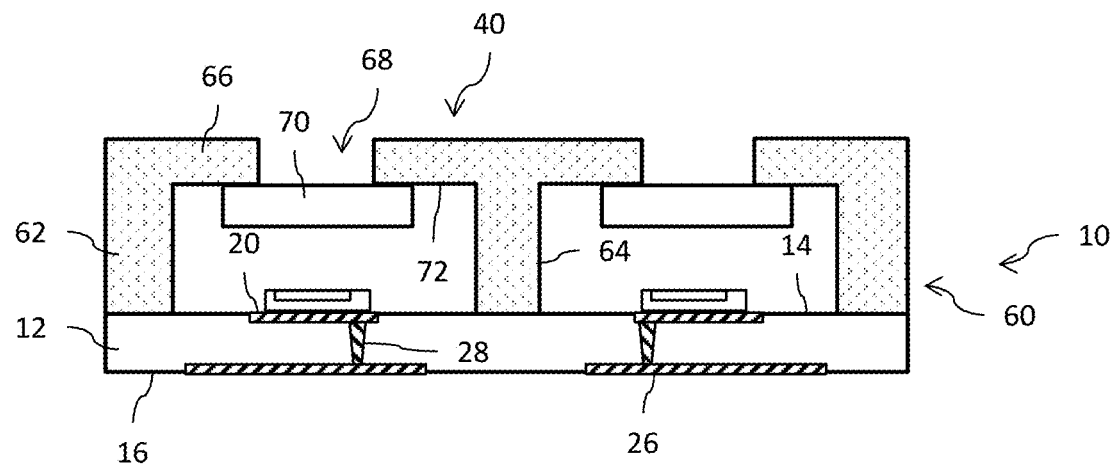
FIGS. 7A and 7B show orthogonal cross-sectional views of an optical sensor package.
Figure 7B:
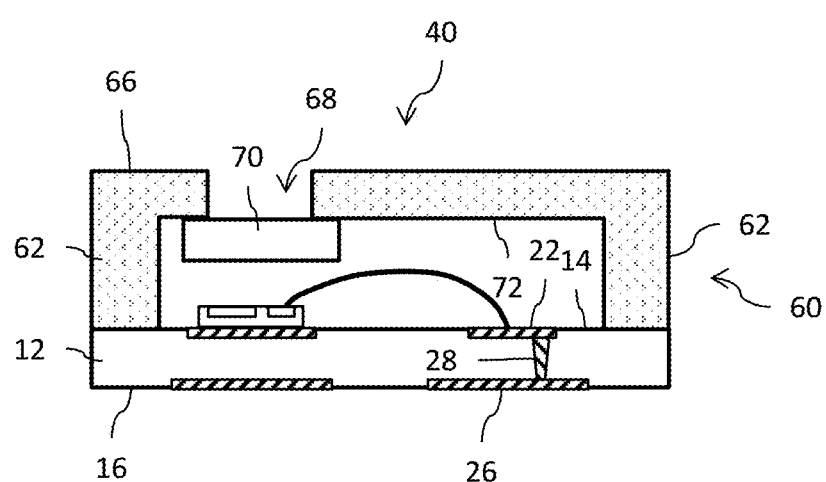
Figure 8:
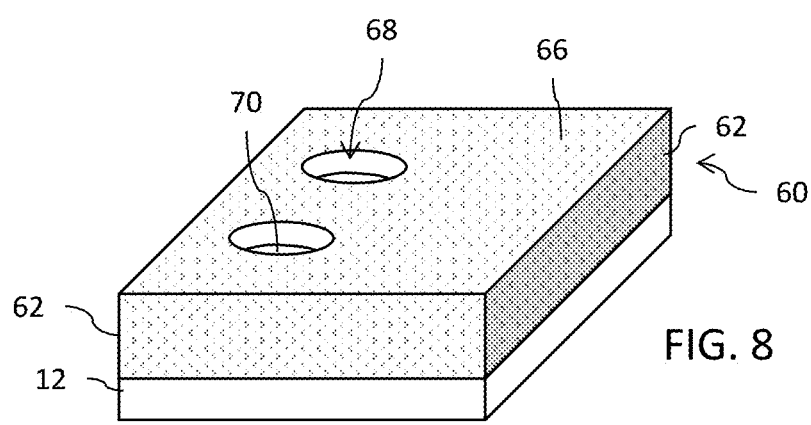
FIG. 8 is a perspective view of the cap structure for the optical sensor package of FIGS. 7A-7B.
Figure 13A:
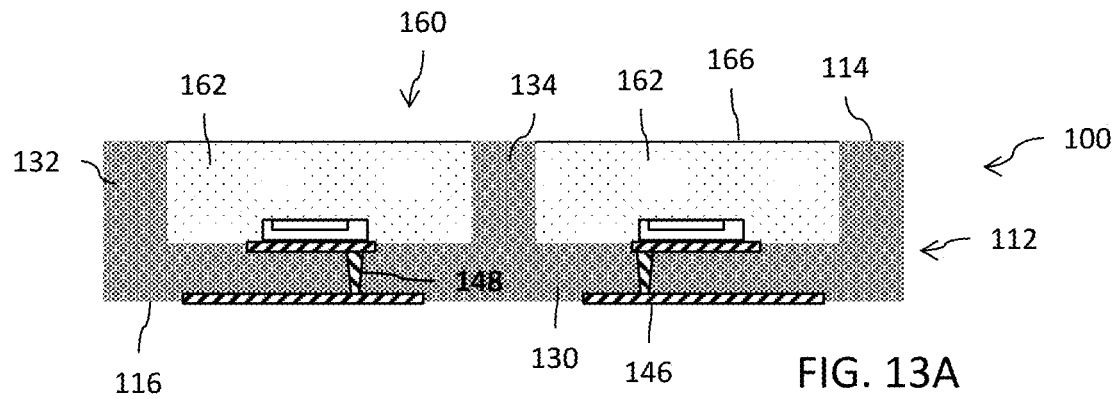
FIGS. 13A and 13B show orthogonal cross-sectional views of an optical sensor package.
Figure 13B:
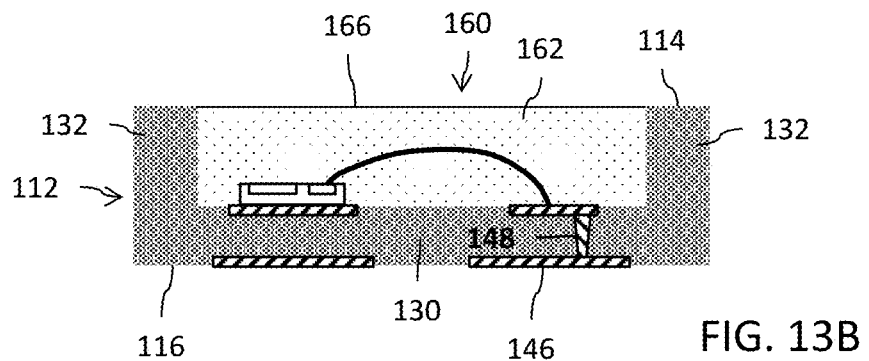
Figure 14A:
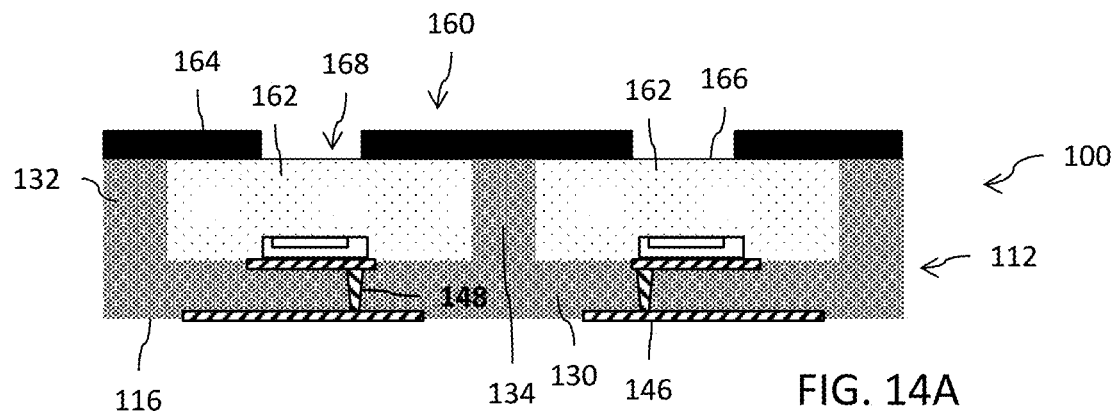
FIGS. 14A and 14B show orthogonal cross-sectional views of an optical sensor package.
Figure 14B:
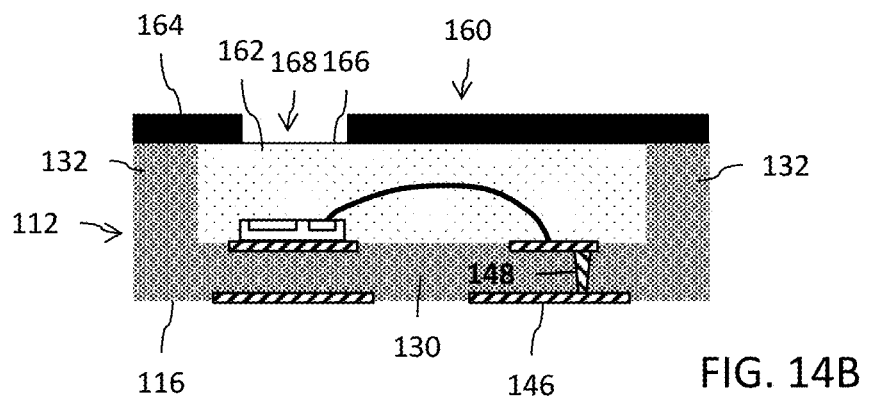
Figure 15A:
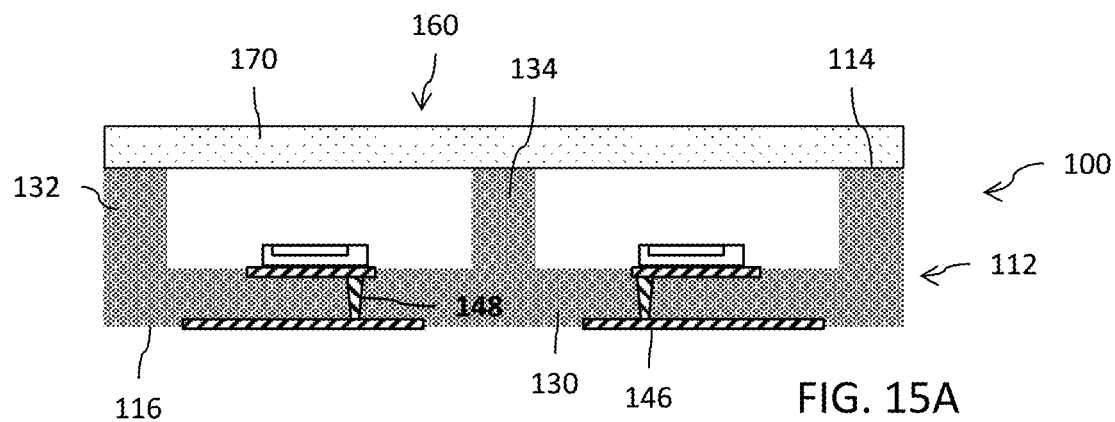
FIGS. 15A and 15B show orthogonal cross-sectional views of an optical sensor package.
Figure 15B:
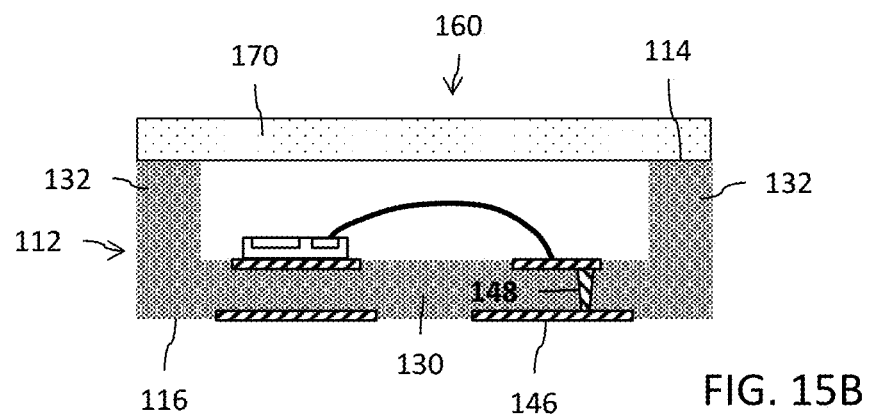

A cap structure 40 is mounted to the front side 14 of the substrate layer 12. The cap structure 40 may have a number of different configurations as shown in FIGS. 1A-1B, 5A-5B and 7A-7B. In the configuration shown in FIGS. 1A-1B, the cap structure 40 comprises a cap frame 42 formed by an outer peripheral wall 44 and an inner wall 46 joining two opposite sides of the outer peripheral wall; with a perspective view as shown in FIG. 4. The cap frame 42 is typically made of an opaque material. A bottom edge of the cap frame is attached to the front side 14 of carrier 12 by way of an adhesive layer (not explicitly shown). In the configuration shown in FIGS. 5A-5B, the cap structure 40 comprises the cap frame 42 and a transparent cover 50 (for example, comprising a light filter and/or optics) mounted to an upper edge of the cap frame by way of an adhesive layer (not explicitly shown); with perspective view as shown in FIG. 6. In the configuration shown in FIGS. 7A-7B, the cap structure 40 comprises a housing 60 including an outer peripheral wall 62, an inner wall 64 joining two opposite sides of the outer peripheral wall, and a cover (or front wall) 66; with a perspective view as shown in FIG. 8. The housing 60 is typically made of an opaque material. A bottom edge of the housing 60 is attached to the front side 14 of the carrier 12 by way of an adhesive layer (not explicitly shown). The cover 66 includes an opening 68 aligned with the location of the optical integrated circuit 32 of each integrated circuit chip 30. A transparent optical element 70 (for example, comprising a light filter and/or optics) is mounted to an underside surface 72 of the cover 66 at the location of each opening 68 by way of an adhesive layer (not explicitly shown).

Reference is made to FIGS. 9A and 9B which show orthogonal cross-sectional views of an optical sensor package 100. A molded carrier 112 is made of a unitary body of material and includes a front side 114 and a back side 116. A plurality of blind openings 118 extend into the unitary body of the molded carrier 112 from the front side 114. Each blind opening 118 is delimited by a sidewall surface 120 and a bottom surface 122. A depth of each opening 118 is less than a thickness of the molded carrier 112. The material for the molded carrier 112 is a laser direct structuring (LDS) material.

As known to those skilled in the art, LDS is a technology where a resin containing additives is molded (for example, injection molded) to form a unitary body. A laser beam can be applied to a surface of the unitary body in order to transfer thereon a desired pattern by activating the additives. A metallization process, such as an electroless plating involving a metal such as copper, nickel and/or gold, is then used to plate a conductive pattern (matching the desired pattern of the activated additives) onto the laser treated surface. The conductive pattern may include, for example, pad structures (for forming die attach pads, bonding pads and/or land grid array (LGA) pads) and line structures (for forming metal traces of a redistribution layer (RDL)). The LDS technology can also be used to form openings in and through the unitary body that when plated (or filled) with metal form interconnection structures such as vias.

The unitary body of the molded carrier 112 includes a floor body portion 130 whose lower surface defines the back side 116 and whose upper surface defines the bottom surface 122 of each blind opening 118. The unitary body of the molded carrier 112 also includes an outer peripheral wall body portion 132 whose outer surface defines the outer surface of the molded carrier 112 and whose inner surface defines parts of the sidewall surface 120 of each blind opening 118. The unitary body of the molded carrier 112 still further includes an inner wall body portion 134 joining two opposite sides of the outer peripheral wall body portion 132 and whose lateral surfaces define further parts of the sidewall surface 120 of each blind opening 118. FIG. 10 shows a perspective view of the unitary body of the molded carrier 112.

FIG. 11 shows a top view of the optical sensor package 100 (i.e., looking down at the front side 114) and FIG. 12 shows a bottom view of the optical sensor package 100 (i.e., looking up at the back side 116).

At least one die attach pad 140 is mounted to the molded carrier 112 at the bottom surface 122 of each blind opening 118. At least one bonding pad 142 is also mounted to the molded carrier 112 at the bottom surface 122 of each blind opening 118. The bottom surface 122 may further include a plurality metal traces (see, reference 145), forming a redistribution layer (RDL), that are electrically connected to the die attach pads 140 and/or the bonding pads 142. A plurality of land grid array (LGA) pads 26 are mounted to the back side 16 of the molded carrier 112. A plurality of metal vias 148 extend through the floor body portion 130 of the molded carrier 112 to electrically interconnect each die attach pad 140 (or the metal trace of the RDL connected thereto, if used) to a corresponding one of the LGA pads 146 and electrically interconnect each bonding pad 142 (or the metal trace of the RDL connected thereto, if used) to a corresponding one of the LGA pads 146.

The metal vias 148 are formed in the molded carrier 112 using LDS processing techniques. A laser is used to open a hole extending completely through the floor body portion 130 of the molded carrier 112 at the locations where vias 148 are desired. This is accomplished using well known laser-drilling techniques. LDS activation of the additives of the LDS material at the sidewall of the hole is then performed using a laser exposure. After LDS activation of the sidewall, the activated sidewall is plated with a conductive material such as copper, nickel and/or gold. Conventional plating techniques can be used for this step (including, for example, an electroless plating process).

The die attach pads 140, bonding pads 142 and RDL metal traces (if utilized) are formed on the bottom surface 122 of each blind opening 118 in the molded carrier 112 using LDS processing techniques. LDS activation of the additives of the LDS material at the bottom surface 122 at the locations where the die attach pads 140, bonding pads 142 and RDL metal traces are desired is performed using a laser exposure in accordance with a pattern corresponding to the desired shapes of the die attach pads 140, bonding pads 142 and RDL metal traces. After LDS activation of the bottom surface 122, the activated portions of the bottom surface 122 are plated with a conductive material such as copper, nickel and/or gold. Conventional plating techniques can be used for this step (including, for example, an electroless plating process).

The LGA pads 146 and RDL metal traces (if utilized) are formed on the back side 116 of the molded carrier 112 using LDS processing techniques. LDS activation of the additives of the LDS material at the back side 116 at the locations where the LGA pads 146 and RDL metal traces are desired is performed using a laser exposure in accordance with a pattern corresponding to the desired shapes of the LGA pads 146 and RDL metal traces. After LDS activation of the back side 116, the activated portions of the back side 116 are plated with a conductive material such as copper, nickel and/or gold. Conventional plating techniques can be used for this step (including, for example, an electroless plating process).

Integrated circuit chips 150 are mounted at the bottom surface 122 of each blind opening 118 to the die attach pads 140. Each integrated circuit chip 150 includes an optical integrated circuit 152 and a bonding pad 154 at a top (or front) surface. As an example, the integrated circuit chips 150 may include a chip 150a with a light emitter for the optical integrated circuit 152 in the form of a vertical-cavity surface-emitting laser (VCSEL) or light emitting diode (LED) and a chip 150b with a light detector for the optical integrated circuit 152 in the form of a photodiode. A bottom (or back) surface of the integrated circuit chip 150 is mounted to the die attach pads 140 using a conductive adhesive (not explicitly shown). A bonding wire 158 electrically connects each bonding pad 154 for the integrated circuit chip 150 to a corresponding one of the bonding pads 142 at the bottom surface 122 of each blind opening 118. It will be noted in positioning the via for the bonding pad 142 that it is important for the via location to be offset from the bonding area for the bonding wire 158. The use of the RDL metal traces 145 can provide a way to effectively offset the via location away from the bonding area of pad 142.

A protective structure 160 may be utilized to protect the integrated circuit chips 150. The protective structure 160 may have a number of different configurations as shown in FIGS. 13A-13B, 14A-14B and 15A-15B. In the configuration shown in FIGS. 13A-13B, the protective structure 160 comprises a transparent material 162 that fills each of the blind openings 118 in the molded carrier 112. In the configuration shown in FIGS. 14A-14B, the protective structure 160 further comprises a cap layer 164 extending over the co-planar front side 114 of the molded carrier 112 and front surface 166 of the transparent material 162 fill. The cap layer 164 is preferably made of an opaque resin material that is transfer molded onto the assembly that includes the molded carrier 112 and the transparent material 162 fill, or the structure or is separately molded and attached to that assembly using an adhesive. The cap layer 164 includes an opening 168 aligned with the location of the optical integrated circuit 152 of each integrated circuit chip 150. In the configuration shown in FIGS. 15A-15B, the protective structure 160 comprises a transparent plate 170 that is attached to the front side 114 of the molded carrier 112. The transparent plate 170 may, for example, be made of a glass material.

Figure 16A:
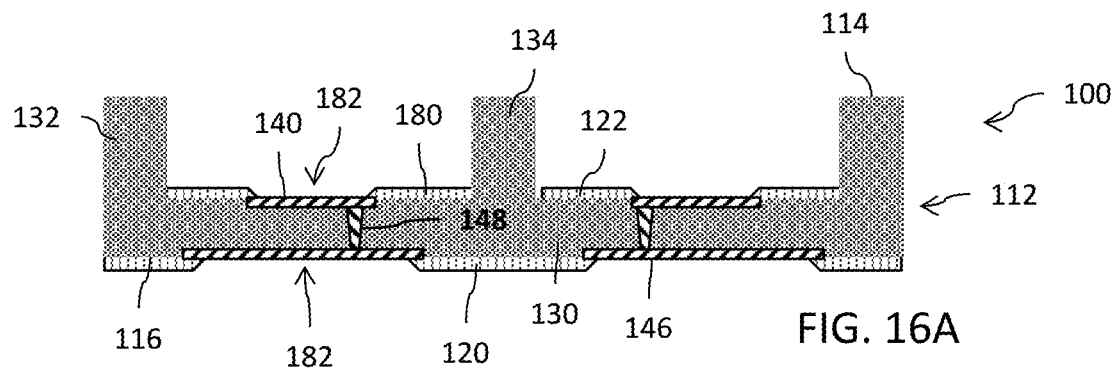
FIGS. 16A and 16B show orthogonal cross-sectional views of an optical sensor package.
Figure 16B:
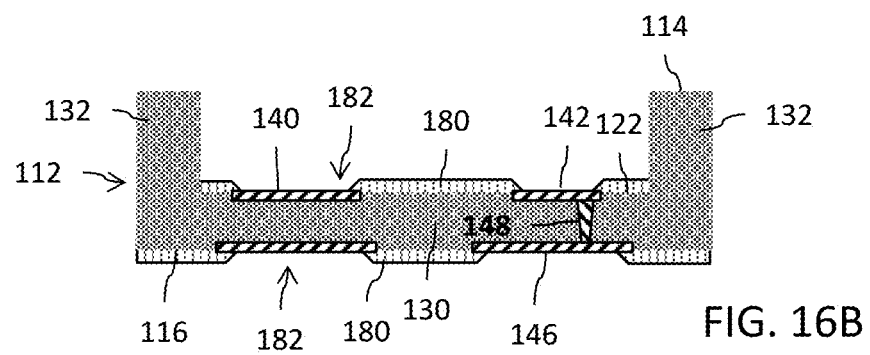

In an embodiment, the molded carrier 112 with LDS fabricated die attach pads 140, bonding pads 142, LGA pads 146 and RDL metal traces as shown in any of the implementations of FIGS. 9A-9B, 13A-13B, 14A-14B and 15A-15B may include a solder resist layer 180 as shown in FIGS. 16A-16B. The layer 180 may be provided on both the bottom surface 122 of each blind opening 118 and the back side 116 of the molded carrier 112 (as shown in FIGS. 16A-16B). Alternatively, the layer 180 may be provided only on the back side 116 of the molded carrier 112. The layer 180 includes openings 182 at the locations of the die attach pads 140, bonding pads 142 and LGA pads 146 (and will typically cover the RDL metal traces, if present).

Figure 2:
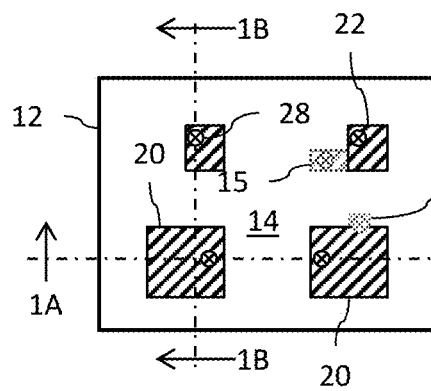
FIG. 2 shows a plan view of a front side of a substrate for the optical sensor package of FIGS. 1A-1B.
Figure 17A:
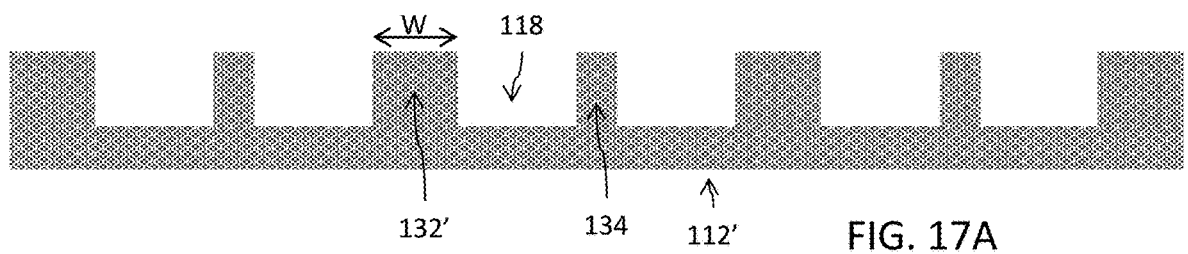
Figure 17B:
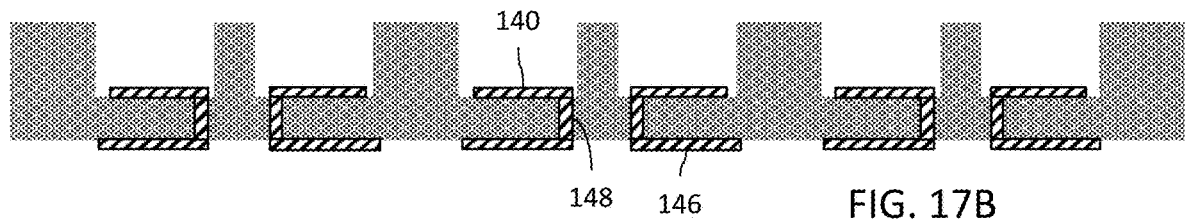
Figure 17C:
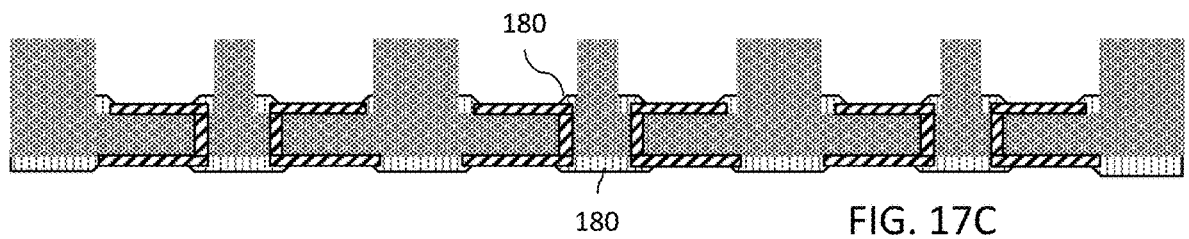
Figure 17D:
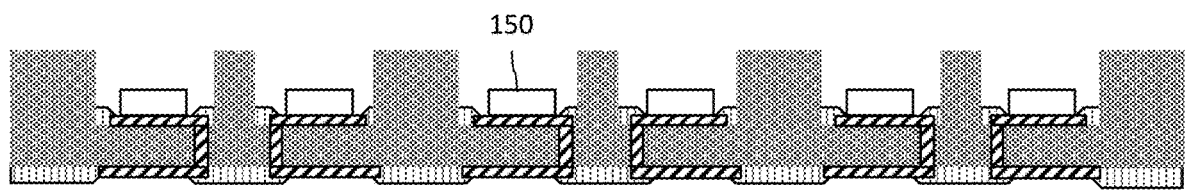
Figure 17E:
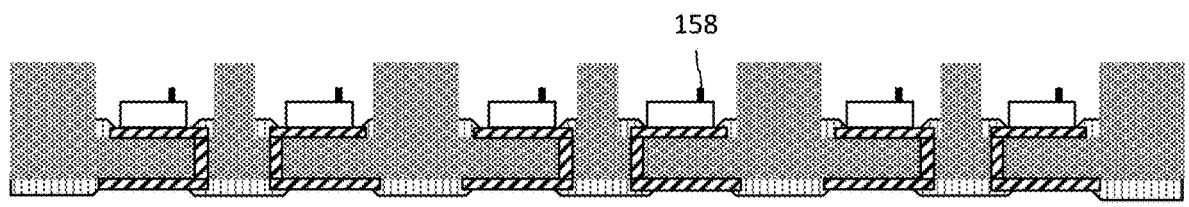

Reference is now made to FIGS. 17A to 171-2 for a description of a wafer scale method of manufacturing the optical sensor packages. FIG. 17A shows the result of a molding process wherein a laser direct structuring (LDS) material is molded to form a wafer-scale carrier 112' that includes a plurality of blind openings 118. Notice should be made of the wall body portions 132' between some of the openings 118 which have a width W that is sufficient to allow cutting therethrough so as to form two peripheral wall body portions 132. The molding process may, for example, utilize well known injection molding techniques where the LDS material is injected into a cavity defined by a closed two-part mold, with the first and second mold forms of the two-part mold defining the faces 114, 116 and the openings 118. FIG. 17B shows the result of the performance of the laser drilling, LDS surface activation and plating operations that define the die attach pads 140, bonding pads 142 (not explicitly shown), LGS pads 146, vias 148 and RDL metal traces (if needed). FIG. 17C shows the result of the performance of the process for depositing and patterning the solder resist layer 180. It will be noted that FIG. 17C shows presence of the solder resist layer 180 on both the bottom surface of each opening 118 and the back side of the carrier 112'. This is just one example implementation, and in an alternative implementation the solder resist layer 180 is provided only on the back side of the carrier 112'. Any suitable deposition or printing process can be used to provide the patterned solder resist layer 180. FIG. 17D shows the result of the performance of the process for attaching the integrated circuit chips 150 to the die attach pads 140. Any suitable pick-and-place operation can be used to install the chips 150 in the openings 118. FIG. 17E shows the result of the performance of the process for electrically connecting the bonding pads of the chips 150 to the bonding pads 142 (not explicitly shown) with a bonding wire 158. Any suitable wirebonding operation can be used to make the electrical connection.

Figures 1, 17F:
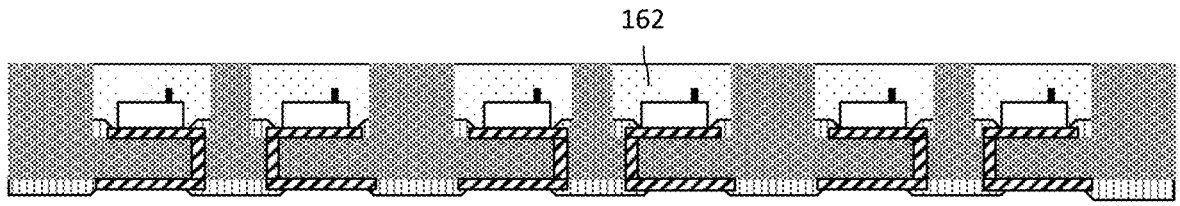
Figures 2, 17F:
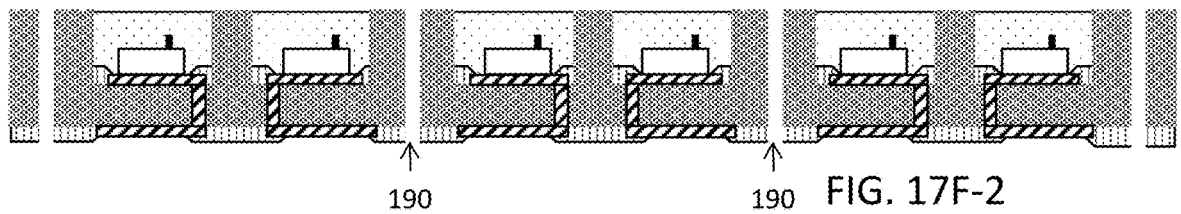

As noted above, there are several options for providing a protective structure 160 protect the integrated circuit chips 150. With respect to the configuration shown in FIGS. 13A-13B, FIG. 17F-1 shows the result of the performance of the process for depositing a transparent material 162 that fills each of the blind openings 118 in the wafer-scale molded carrier 112'. FIG. 17F-2 shows the result of the performance of the process for singulating the assembly by cutting through (reference 190) the walls 132' to produce individual optical sensor packages.

Figures 1, 17G:
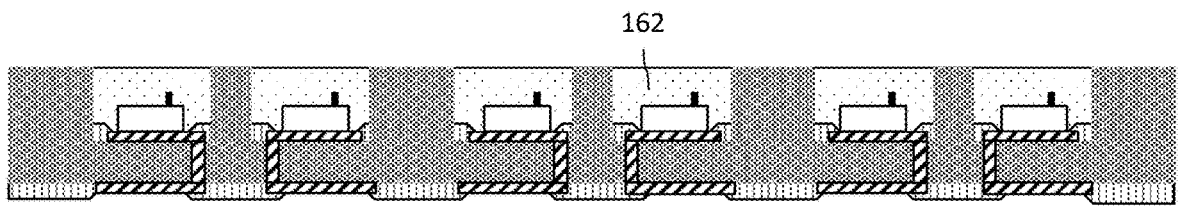
Figures 2, 17G:
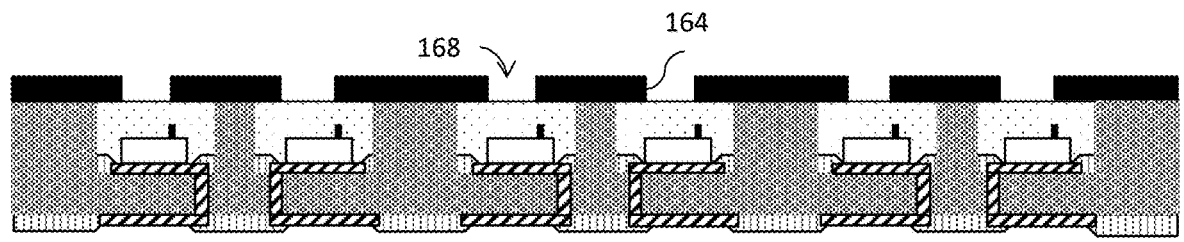
Figures 3, 17G:
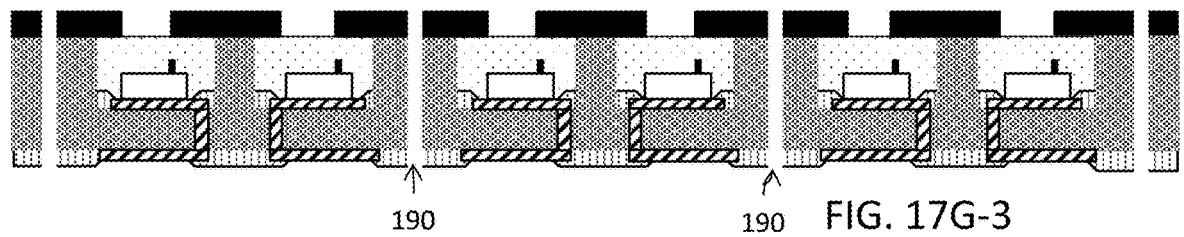

With respect to the configuration shown in FIGS. 14A-14B, FIG. 17G-1 shows the result of the performance of the process for depositing a transparent material 162 that fills each of the blind openings 118 in the wafer-scale molded carrier 112'. FIG. 17G-2 shows the result of the performance of the process for providing a cap layer 164 (with openings 168) extending over the co-planar front side of the wafer-scale molded carrier 112' and front surface of the transparent material 162 fill. The cap layer 164 is preferably made of an opaque resin material that is transfer molded onto the assembly that includes the wafer-scale molded carrier 112' and the transparent material 162 fill, or the structure or is separately molded and attached to that assembly using an adhesive. FIG. 17G-3 shows the result of the performance of the process for singulating the assembly by cutting through (reference 190) the walls 132' to produce individual optical sensor packages.

Figures 1, 17H:
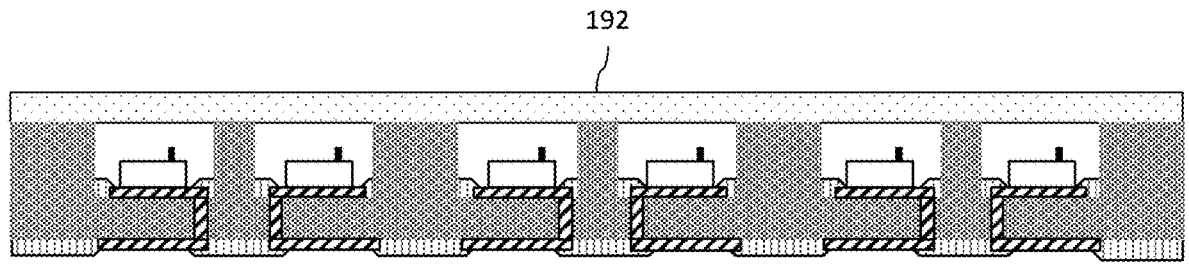
Figures 2, 17H:
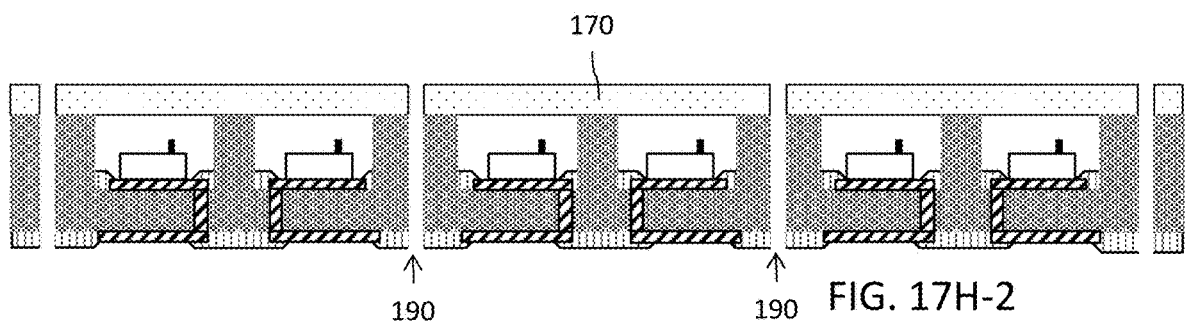

With respect to the configuration shown in FIGS. 15A-15B, FIG. 17H-1 shows the result of the performance of the process for attaching a transparent wafer 192 to the front side of the wafer-scale molded carrier 112'. FIG. 17H-2 shows the result of the performance of the process for singulating the assembly by cutting through (reference 190) the walls 132' and wafer 192 to produce individual optical sensor packages, where each package includes a transparent plate 170.

Figures 1, 17I:
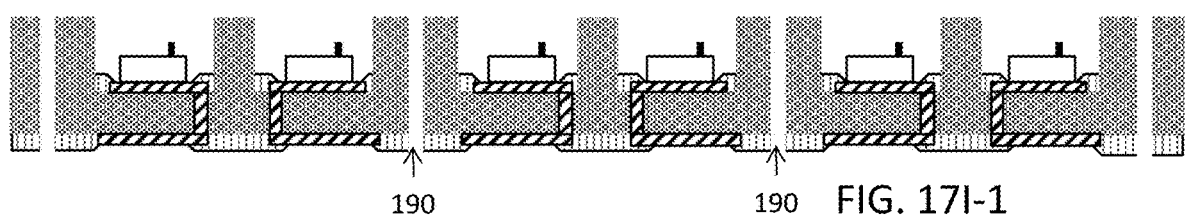
Figures 2, 17I:
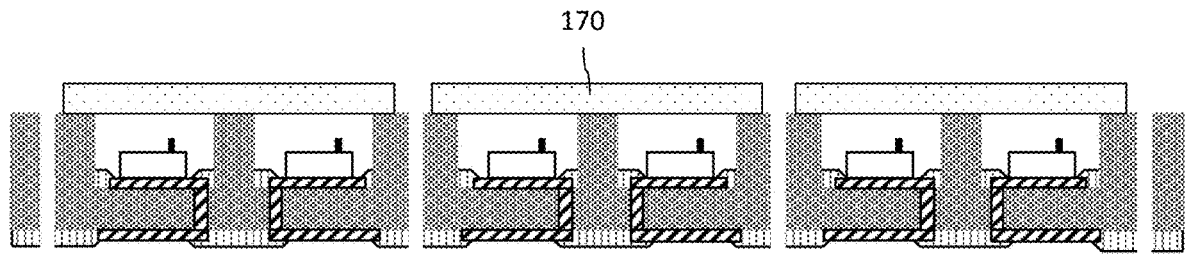

In an alternative implementation for the configuration shown in FIGS. 15A-15B, FIG. 17I-1 shows the result of the performance of the process for singulating the assembly by cutting through (reference 190) the walls 132' to produce a plurality of assemblies, with each assembly including the molder carrier 112. FIG. 17I-2 shows the result of the performance of the process for attaching the transparent plate 170 to the front side of the molded carrier 112 for each singulated assembly.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A package, comprising:
    a molded carrier formed by a unitary body made of a laser direct structuring (LDS) material and including a back side and a front side with a blind opening extending into the unitary body of the molded carrier from the front side, said blind opening delimited by a sidewall surface and a bottom surface, wherein the unitary body includes: a floor body portion having a lower surface defining said back side and an upper surface defining the bottom surface of the blind opening and an outer peripheral wall body portion whose outer surface defines an outer surface of the molded carrier and whose inner surface defines at least part of the sidewall surface of the blind opening;
    a first die attach pad at the bottom surface of the blind opening;
    a first bonding pad at the bottom surface of the blind opening;
    a plurality of land grid array (LGA) pads at the back side; and
    a plurality of vias extending through the floor body portion to electrically connect the die attach pad to one LGA pad and electrically connect the bonding pad to another LGA pad;
    wherein said first die attach pad, first bonding pad, LGA pads and vias are formed by platings at LDS activated surfaces of the molded carrier.

2. The package of claim 1, further comprising: an integrated circuit chip mounted to the first die attach pad and electrically connected by a first bonding wire to the first bonding pad.

3. The package of claim 2, further comprising a protective structure comprising a transparent material filling the blind opening and covering the integrated circuit chip.

4. The package of claim 3, wherein the protective structure further comprises a cap layer extending over the front side of the molded carrier and a front surface of the transparent material filling.

5. The package of claim 4, wherein the cap layer is made of an opaque material.

6. The package of claim 4, wherein the cap layer is made of a resin material.

7. The package of claim 4, wherein the cap layer is a transfer molded structure.

8. The package of claim 4, wherein the cap layer is adhesively attached to the front side of the molded carrier and front surface of the transparent material filling.

9. The package of claim 4, wherein the integrated circuit chip includes an optical integrated circuit and wherein the cap layer includes an opening aligned with a location of the optical integrated circuit of the integrated circuit chip.

10. The package of claim 2, further comprising a protective structure comprising a transparent plate extending over the blind opening and covering the integrated circuit chip.

11. The package of claim 1, further comprising a solder resist layer on the bottom surface of the blind opening, said solder resist layer including openings that expose at least parts of said first die attach pad and first bonding pad.

12. The package of claim 1, further comprising a solder resist layer on the back side of the molded carrier, said solder resist layer including openings that expose at least parts of said LGA pads.

13. The package of claim 1, wherein the unitary body further includes an inner wall body portion joining two opposite sides of the outer peripheral wall body portion, said inner wall body portion having a lateral surface that defines a further part of the sidewall surface of the blind opening.

14. The package of claim 13, further comprising: a second die attach pad at the bottom surface and a second bonding pad at the bottom surface, wherein said second die attach pad and said second bonding pad are located at an opposite side of the inner wall body portion from said first die attach pad and first bonding pad.

15. The package of claim 14, further comprising:
    a first integrated circuit chip mounted to the first die attach pad and electrically connected by a first bonding wire to the first bonding pad; and a second integrated circuit chip mounted to the second die attach pad and electrically connected by a second bonding wire to the second bonding pad.

\* \* \* \* \*